(12) United States Patent
Shih et al.

(10) Patent No.: US 6,205,024 B1
(45) Date of Patent: Mar. 20, 2001

(54) HEAT SINK FOR RECTIFIER

(75) Inventors: Chun-Min Shih; Yi-Ching Chen, both of Taipei (TW)

(73) Assignee: Kalem Technology Corporation, Taipei (TW)

( * ) Notice: Subject to any disclaimer, the term of this patent is extended or adjusted under 35 U.S.C. 154(b) by 0 days.

(21) Appl. No.: 09/490,170

(22) Filed: Jan. 22, 2000

(51) Int. Cl.[7] ....................................................... H05K 7/20
(52) U.S. Cl. ........................... 361/704; 361/705; 361/707; 174/252; 165/80.3; 310/68 D
(58) Field of Search ..................................... 361/702, 703, 361/704, 705, 707, 708–710, 141, 145; 257/720, 722; 174/16.3, 252; 165/80.3, 185; 310/68 D, 68 R

(56) References Cited

U.S. PATENT DOCUMENTS

| | | | |
|---|---|---|---|
| 3,927,338 | * 12/1975 | Vieilleribiere | 310/68 D |
| 3,959,676 | * 5/1976 | Striker | 310/68 D |
| 4,059,778 | * 11/1977 | Sohnle | 310/68 D |
| 5,043,614 | * 8/1991 | Yockey | 310/68 D |
| 5,424,594 | * 6/1995 | Saito et al. | 310/68 D |
| 5,473,208 | * 12/1995 | Stihi | 310/68 D |
| 5,646,838 | * 7/1997 | Keidar et al. | 363/145 |
| 5,659,212 | * 8/1997 | DePetris | 310/68 D |
| 5,737,210 | * 4/1998 | Barahia | 361/144 |
| 5,812,388 | * 9/1998 | Keidar et al. | 363/145 |
| 5,828,564 | * 10/1998 | Mori et al. | 363/141 |
| 5,866,963 | * 2/1999 | Weiner et al. | 310/68 D |

* cited by examiner

Primary Examiner—Leo P. Picard
Assistant Examiner—Boris L. Chervinsky

(57) ABSTRACT

A heat sink for a rectifier comprises two heat sink plates, six nail connectors and six diodes. Six diodes are formed by with packaging six dice during the heat sink manufacturing process so that the six diodes are completely embedded into six holes. Therefore, the heat generated by rectifying AC power to DC power may be well distributed around the main body of the heat sink to avoid water infiltration and particle contamination. The attachment between diodes and heat sink may be enforced.

2 Claims, 6 Drawing Sheets

HEAT SINK FOR RECTIFIER

FIELD OF THE INVENTION

The present invention relates generally to a heat sink for a rectifier of an alternator, and more particularly to a heat sink for a rectifier with diodes embedded in the heat sink completely.

BACKGROUND OF THE INVENTION

Conventional rectifiers for alternators known in the art have diodes that are secured to the surface of a heat sink by soldering or brazing. When an alternating current goes through the diodes, heat generated by the diodes may not be well distributed through the heat sink because the diodes are only attached to the heat sink with small contact areas. Therefore, heat may be dissipated insufficiently and result in damage of the rectifier.

In the conventional rectifier, the anode or cathode of a diode is typically secured to the heat sink by soldering or brazing. The attachment between the heat sink and a diode is only accomplished by one small attaching end. After a long period of vibration or a huge unexpected shake, the attachment may be loose or even totally disconnected. In addition, the diode is usually attached on an external surface that is susceptible to water infiltration.

A known technique using press-fit diodes has been adopted to overcome the drawbacks just mentioned above. As in FIG. 8, the metal case 53 is used to package the die 52 with the nail connector 51. The combinations are called press-fit diodes 5. Die 52 is completely embedded in the metal case 53 to avoid water infiltration and particle contamination. The press-fit diodes 5 are installed into the holes 21 and holes 31 from the bottom of the first sink plate 2 and the second sink plate 3. Because the press-fit diodes 5 are completely pressed into the holes 21 and 31, heat generated due to rectification can be well distributed around the first sink plate 2 and the second sink plate 3. And, the die 52 is completely secured. Therefore, the drawbacks described above can be overcome. However, there are still some shortcomings. The metal case 53 should be made by casting or lathing process. This makes the cost higher than before. The press-fit diodes 5 must be formed firstly before they are pressed into holes 21 and 31. This increases the labor cost. In addition, when press-fit diodes 5 are installed into holes 21 and 31, gaps exist between the metal case 53 and the sink plates 2 or 3. This will significantly reduce the heat dissipation efficiency.

SUMMARY OF THE INVENTION

The primary object of the present invention is to provide an improved heat sink to uniformly distribute heat generated by the diodes. In the heat sink, holes are created for dice of diodes. Diodes may be formed and completely embedded into the main body of the heat sink. Therefore, the dice packaging of diodes may be accomplished during rectifier manufacturing process. Because diodes are built into holes in the heat sink, the heat on diodes may be well distributed around the heat sink. Therefore, heat dissipation by the heat sink will be more efficient with the improved structure.

According to the present invention, dice of diodes are completely embedded in the holes formed on the heat sinks. Dice of diodes may be completely placed into a hole and then an insulating material is installed to fill up the space between dice and the heat sink. Therefore, during heat sink manufacturing, diode packaging process is also accomplished at the same time.

By combining the manufacturing of the heat sink and the packaging of the diodes, the attachment between diodes and the heat sink is greatly enhanced. Because dice of diodes are completely built in the holes and sealed up, diodes are well protected to prevent from water infiltration and particle contamination.

Another object of the invention is to provide an improved heat sink with simplified assembling steps and reduced manufacturing cost. By packaging dice of diodes directly into holes in the heat sink, several assembled parts are eliminated during the manufacturing process. Not only is the assembly process simplified but also the manufacturing cost is reduced.

Other features and advantages of the invention will become better understood from the following description of the invention which refers to the accompanying drawings.

DESCRIPTION OF THE PREFERRED EMBODIMENTS

Figure 1:
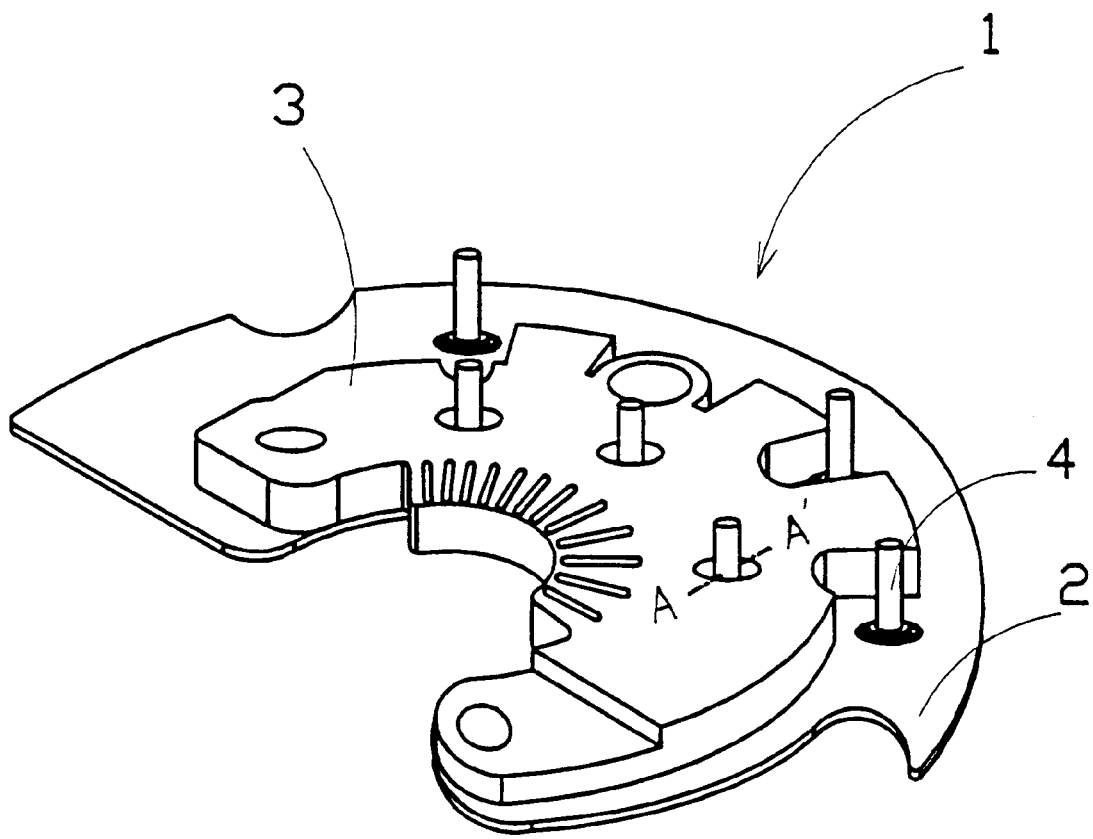
FIG. 1 is a perspective view of the heat sink in accordance with the present invention.
Figure 2:
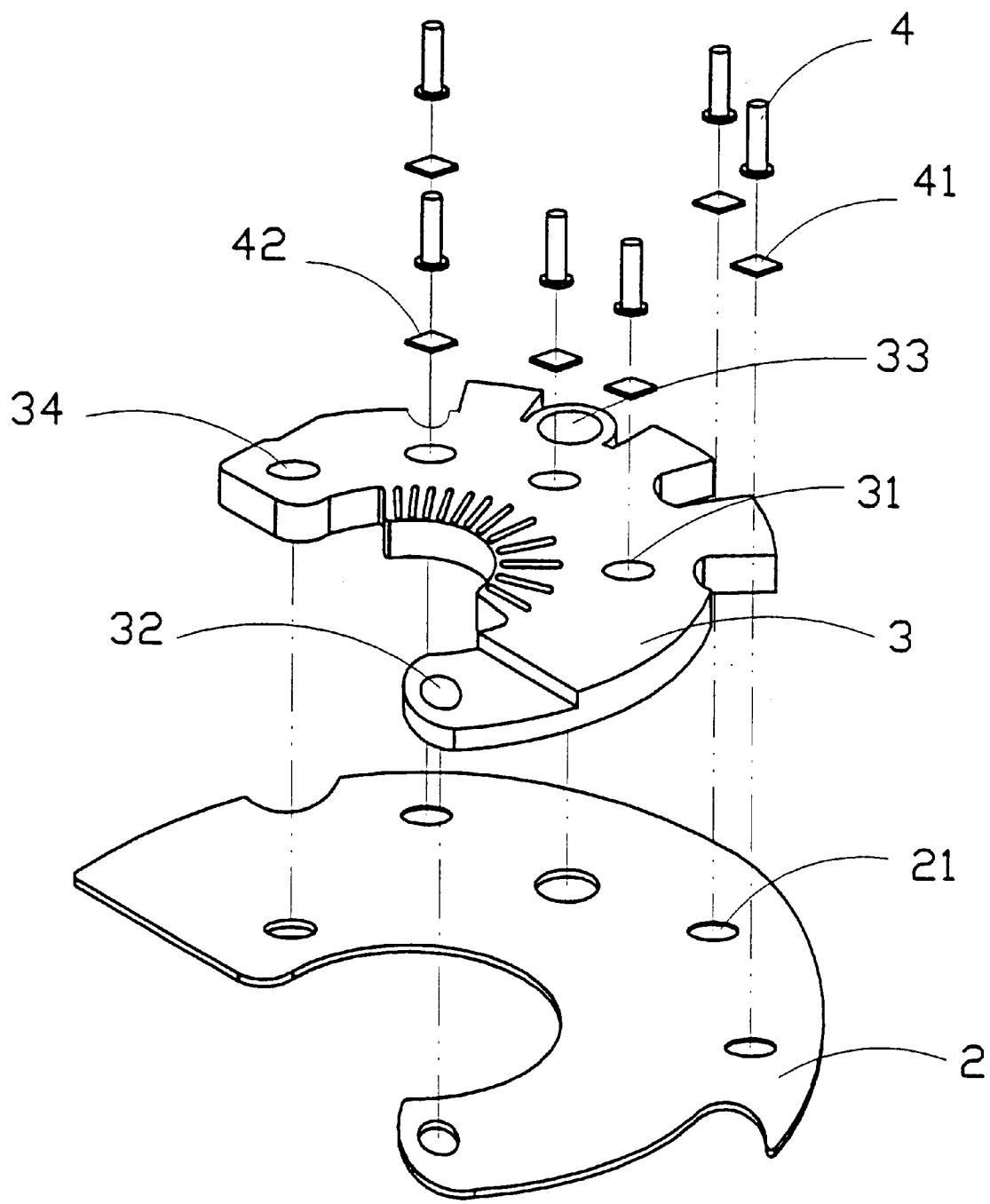
FIG. 2 is an exploded view of the heat sink in accordance with the present invention.

Heat sink 1 for rectifiers made in accordance with the present invention is disclosed in FIG. 1. With reference to FIG. 1, the first sink plate 2 and the second sink plate 3 make up the heat sink 1 of the present invention. On the first sink plate 2 and the second sink plate 3, six holes 21 and 31 are created for embedding six dice 41 and 42, (as shown in FIG. 2). Six nail connectors 4 respectively attach to six dice 41 and 42 for outputting DC power. The first heat sink plate 2 and the second heat sink plate 3 engage with each other by screws fit into countersinks 32, 33, and 34. Because the six dice 41 and 42 are completely embedded in the heat sink, heat generated during rectification will be distributed uniformly around the main body of the first sink plate 2 and the second sink plate 3. Therefore, the heat dissipation efficiency of the heat sink 1 is improved.

Figure 3:
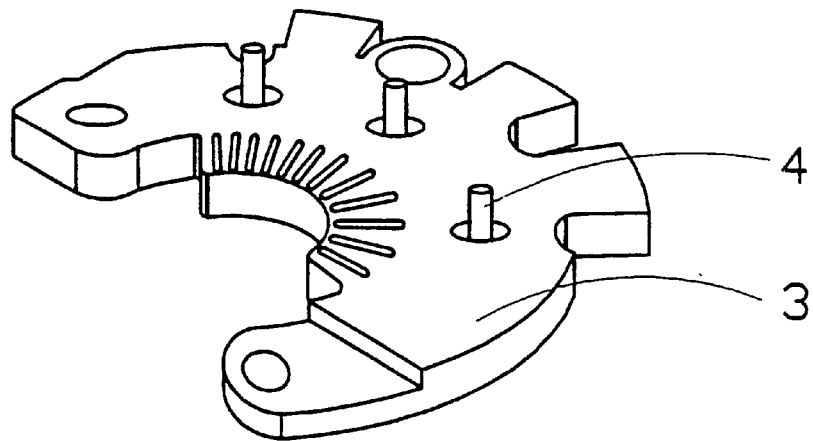
FIG. 3 shows a perspective view of the second heat sink plate.
Figure 4:
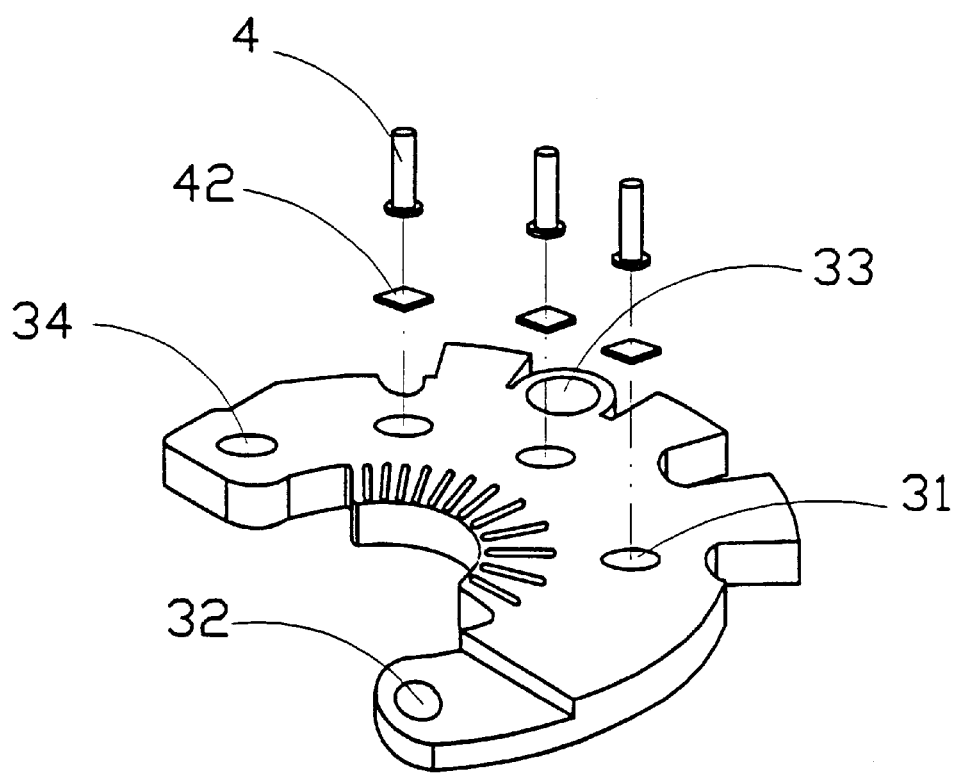
FIG. 4 is an exploded view of the second heat sink plate.
Figure 5:
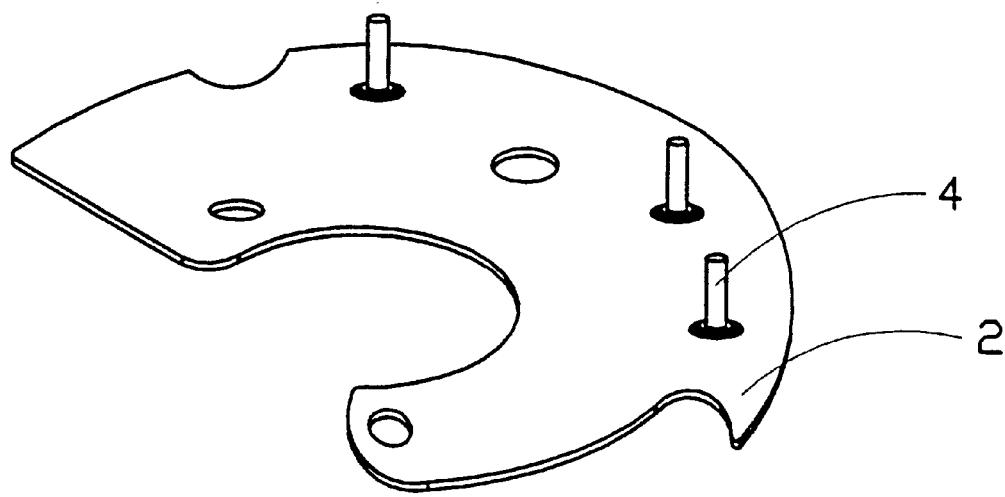
FIG. 5 shows a perspective view of the first heat sink plate.
Figure 6:
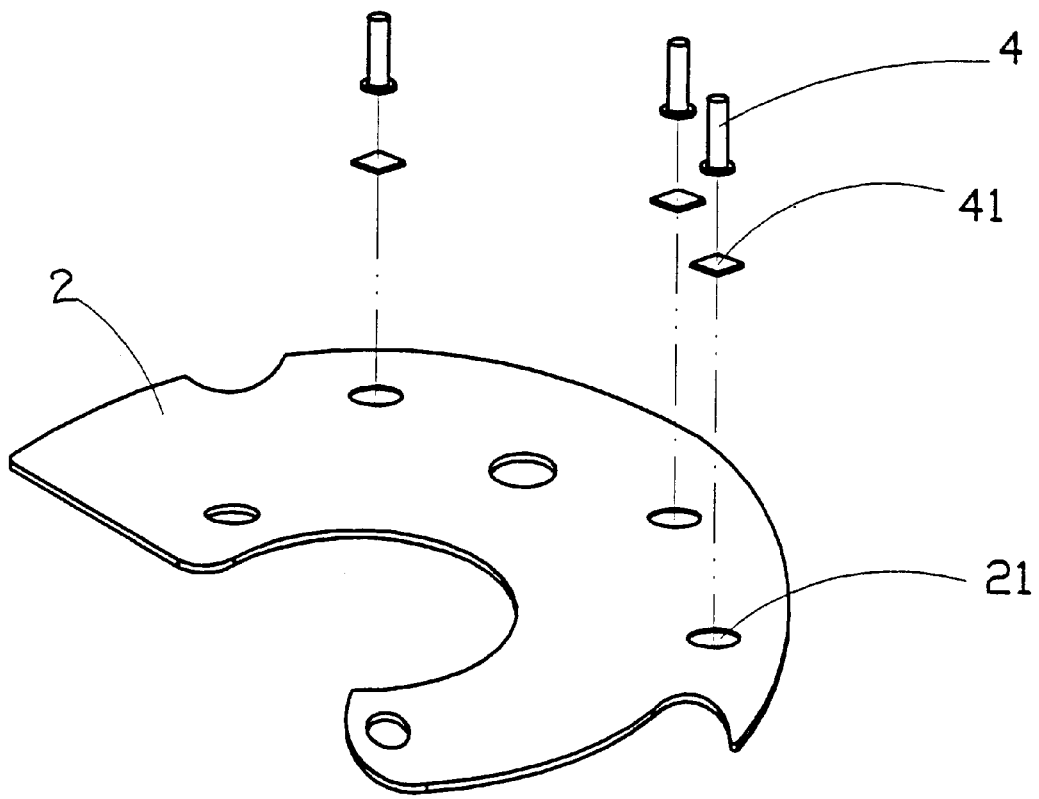
FIG. 6 is an exploded view of the first heat sink plate.

FIG. 3 and FIG. 5 illustrate a perspective view of the first heat sink plate 2 and the second heat plate 3, dice 41 and 42, and nail connectors 4 in accordance with the present invention. FIG. 4 and FIG. 6 show the exploded view of the first heat sink plate 2, the second heat sink plate 3, dice 41 and 42 of diodes, and nail connectors 4 assembled orderly. During the manufacturing process, dice 41 and 42 are completely embedded into holes 21 and 31 respectively. Dice 41 and 42 are packaged inside holes 21 and 31 by injecting insulating material, and then diodes are formed without any further semiconductor packaging process. Therefore, water infiltration and particle contamination may be avoided. The process also reduces manufacturing cost and simplifies assembling steps.

Figure 7:
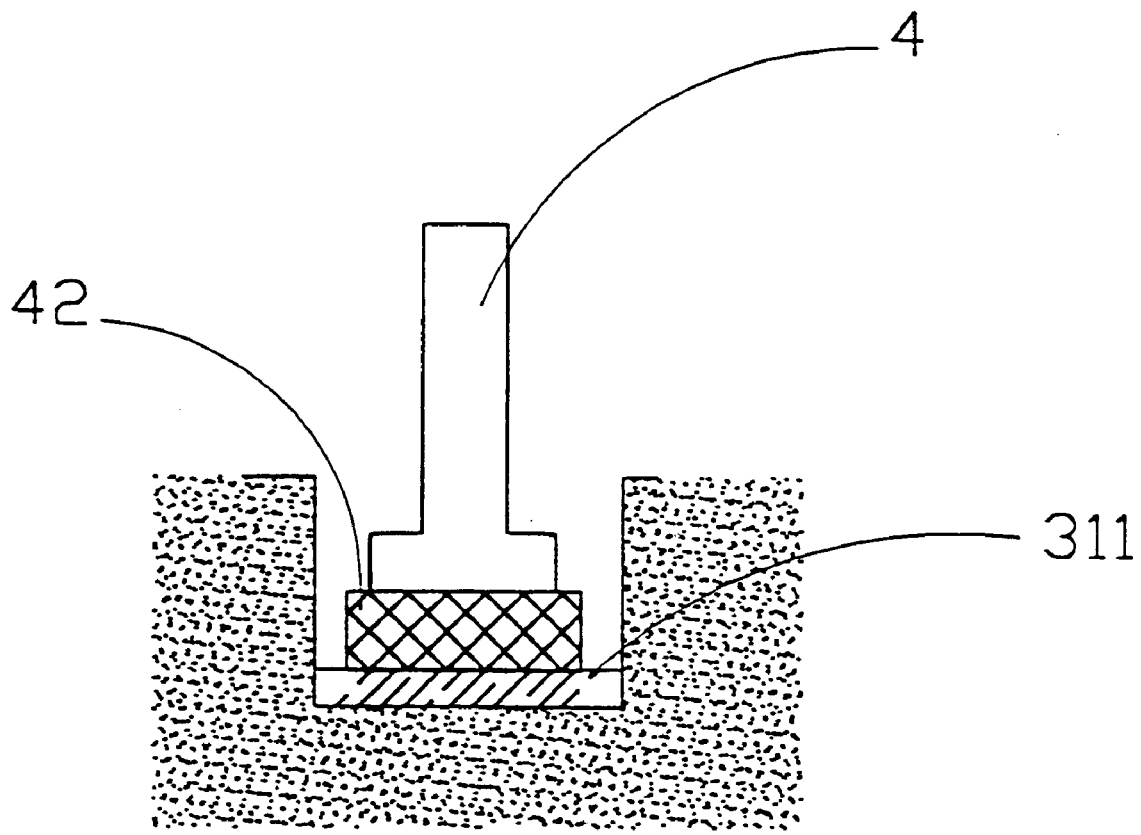
FIG. 7 is a cross-sectional view taken along line A–A' in FIG. 1.
Figure 8:
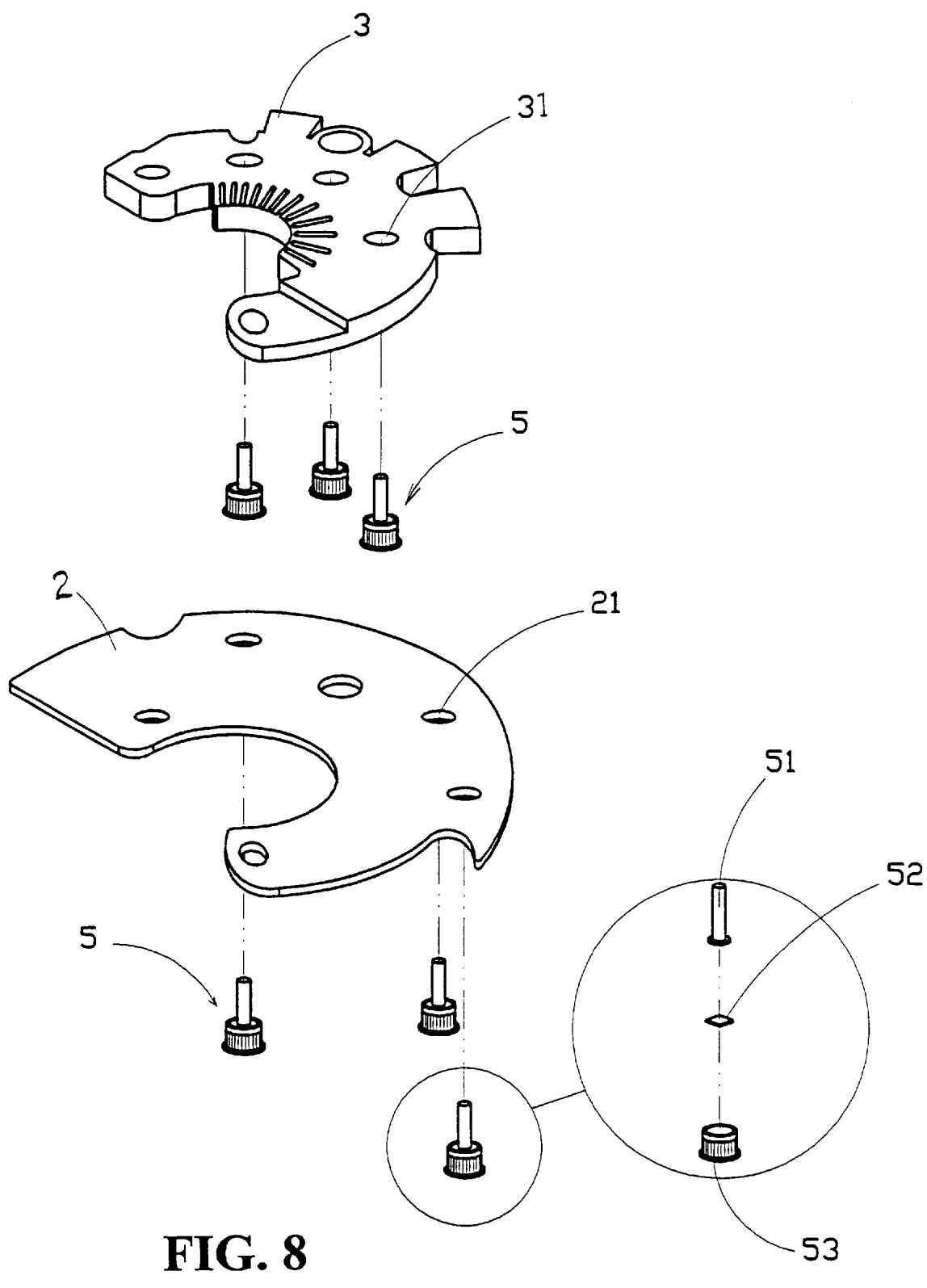
FIG. 8 is an exploded view of the heat sink in accordance with press-fit diodes.

FIG. 7 shows the cross-sectional view taken along line A–A' of FIG. 1. The bottom of the hole may be processed by silver or nickel electoplating. Copper plate can also be inserted instead of using the electroplating process. Therefore, soldering can be accessed on the first heat sink plate 2 and the second heat sink plate 3 between dice 42 and the bottom 311 inside the six holes 21 and 31 shown in FIGS. 4 and 6.

Although this invention has been described with a certain degree of particularity, it should be understood that the present disclosure has been made by the way of the preferred embodiment only and that numerous changes in the detailed construction and combination as well as arrangement of parts may be restored to without departing from the spirit or scope of the invention as hereinafter set forth.

What is claimed is:

1. A heat sink for a rectifier having first and second heat sink plates being engaged with each other, each heat sink plate including a plurality of holes formed thereon and each hole having a flat bottom, a copper plate located on said flat bottom, a diode dice positioned directly above said copper plate, and a nail connector attached to said diode dice, wherein said diode dice is completely embedded in said hole and packaged as a diode at the same time as said heat sink is manufactured.

2. A heat sink for a rectifier having first and second heat sink plates being engaged with each other, each heat sink plate including a plurality of holes formed thereon and each hole having a flat bottom processed with silver or nickel electroplating, a diode dice positioned directly above said electroplated flat bottom, and a nail connector attached to said diode dice, wherein said diode dice is completely embedded in said hole and packaged as a diode at the same time as said heat sink is manufactured.

* * * * *